United States Patent
Boughton (10) Patent No.: US 9,284,210 B2
(45) Date of Patent: Mar. 15, 2016

(54) METHODS AND APPARATUS FOR MATERIAL PROCESSING USING DUAL SOURCE CYCLONIC PLASMA REACTOR

(71) Applicant: Corning Incorporated, Corning, NY (US)

(72) Inventor: Daniel Robert Boughton, Rushville, NY (US)

(73) Assignee: CORNING INCORPORATED, Corning, NY (US)

( * ) Notice: Subject to any disclaimer, the term of this patent is extended or adjusted under 35 U.S.C. 154(b) by 152 days.

(21) Appl. No.: 14/230,846

(22) Filed: Mar. 31, 2014

(65) Prior Publication Data

US 2015/0274569 A1  Oct. 1, 2015

(51) Int. Cl.

| C03B 19/10 | (2006.01) |
|---|---|
| C03B 3/00 | (2006.01) |
| H01J 37/32 | (2006.01) |
| C03B 3/02 | (2006.01) |
| H05H 1/24 | (2006.01) |
| H05H 1/46 | (2006.01) |

(52) U.S. Cl.
CPC ............... *C03B 19/109* (2013.01); *C03B 3/026* (2013.01); *C03B 19/1005* (2013.01); *C03B 19/1095* (2013.01); *H01J 37/3211* (2013.01); *H01J 37/32091* (2013.01); *H01J 37/32541* (2013.01); *H05H 1/2406* (2013.01); *H05H 1/46* (2013.01); *H05H 2001/2462* (2013.01); *H05H 2001/466* (2013.01); *H05H 2001/4667* (2013.01)

(58) Field of Classification Search
None
See application file for complete search history.

(56) References Cited

U.S. PATENT DOCUMENTS

| 5,081,397 A | 1/1992 | Liang et al. ............... 315/111.21 |
| 5,403,453 A | 4/1995 | Roth et al. ..................... 204/164 |
| 5,414,324 A | 5/1995 | Roth et al. ............... 315/111.21 |
| 5,456,972 A | 10/1995 | Roth et al. ..................... 428/224 |
| 5,669,583 A | 9/1997 | Roth .............................. 244/130 |
| 5,711,664 A | 1/1998 | Jegou et al. ................... 432/116 |
| 5,750,822 A * | 5/1998 | Gotovchikov .......... C03B 5/005 110/236 |
| 5,938,854 A | 8/1999 | Roth ................................. 134/1 |
| 6,042,370 A | 3/2000 | Weide ........................... 432/103 |

(Continued)

FOREIGN PATENT DOCUMENTS

| CN | 101767202 | 7/2010 |
| CN | 202310265 | 7/2012 |

(Continued)

OTHER PUBLICATIONS

C. Huang, et al., "Contact Angle Analysis of Low-Temperature Cyclonic Atmospheric Pressure Plasma Modified Polyethylene Terephthalate", *Thin Solid Films*, 2010, vol. 518, pp. 3575-3580.

(Continued)

*Primary Examiner* — Lisa Herring
(74) *Attorney, Agent, or Firm* — Jason A. Barron (57) ABSTRACT

Methods and apparatus provide for: feeding glass batch material into a plasma containment vessel; directing one or more sources of plasma gas into an inner volume of the plasma containment vessel in such a way that the plasma gas swirls in a cyclonic fashion within the plasma containment vessel; and applying first and second electromagnetic fields to the plasma gas to facilitate production of a plasma plume within the inner volume of the plasma containment vessel, where the plasma plume is of a generally cylindrical configuration, and is of sufficient thermal energy to cause the glass batch material to thermally react.

22 Claims, 4 Drawing Sheets

(56) References Cited

U.S. PATENT DOCUMENTS

| | | | |
|---|---|---|---|
| 6,348,126 B1 | 2/2002 | Hanawa et al. | 156/345 |
| 6,410,449 B1 | 6/2002 | Hanawa et al. | 438/706 |
| 6,453,842 B1 | 9/2002 | Hanawa et al. | 118/723 |
| 6,468,388 B1 | 10/2002 | Hanawa et al. | 156/345.48 |
| 6,494,986 B1 | 12/2002 | Hanawa et al. | 156/345.35 |
| 6,551,446 B1 | 4/2003 | Hanawa et al. | 156/345.48 |
| 6,893,907 B2 | 5/2005 | Maydan et al. | 438/149 |
| 6,919,527 B2 | 7/2005 | Boulos et al. | 219/121.52 |
| 6,939,434 B2 | 9/2005 | Collins et al. | 156/345.35 |
| 7,037,813 B2 | 5/2006 | Collins et al. | 438/510 |
| 7,094,316 B1 | 8/2006 | Hanawa et al. | 156/345.48 |
| 7,094,670 B2 | 8/2006 | Collins et al. | 438/513 |
| 7,137,354 B2 | 11/2006 | Collins et al. | 118/723 |
| 7,166,524 B2 | 1/2007 | Al-Bayati et al. | 438/530 |
| 7,183,177 B2 | 2/2007 | Al-Bayati et al. | 438/458 |
| 7,223,676 B2 | 5/2007 | Hanawa et al. | 438/515 |
| 7,264,688 B1 | 9/2007 | Paterson et al. | 156/345.34 |
| 7,288,491 B2 | 10/2007 | Collins et al. | 438/780 |
| 7,291,545 B2 | 11/2007 | Collins et al. | 438/510 |
| 7,294,563 B2 | 11/2007 | Al-Bayati et al. | 438/513 |
| 7,303,982 B2 | 12/2007 | Collins et al. | 438/514 |
| 7,320,734 B2 | 1/2008 | Collins et al. | 118/726 |
| 7,393,765 B2 | 7/2008 | Hanawa et al. | 438/515 |
| 7,430,984 B2 | 10/2008 | Hanawa et al. | 118/723 I |
| 7,465,478 B2 | 12/2008 | Collins et al. | 427/523 |
| 7,479,456 B2 | 1/2009 | Buchberger et al. | 438/706 |
| 7,622,693 B2 | 11/2009 | Foret | 219/121.43 |
| 7,642,180 B2 | 1/2010 | Al-Bayati et al. | 438/513 |
| 7,665,407 B2 | 2/2010 | Hwang et al. | 110/250 |
| 7,700,465 B2 | 4/2010 | Collins et al. | 438/513 |
| 7,743,730 B2 | 6/2010 | Kholodenko et al. | 118/723 |
| 8,002,992 B2 | 8/2011 | Foret | 210/748.02 |
| 8,324,523 B2 | 12/2012 | Foret | 219/121.43 |
| 8,357,873 B2 | 1/2013 | Foret | 219/121.43 |
| 8,361,404 B2 | 1/2013 | Gutsol et al. | 422/186.21 |
| 8,366,925 B2 | 2/2013 | Foret | 210/198.1 |
| 2003/0047449 A1 | 3/2003 | Hanawa et al. | 204/298.06 |
| 2003/0226641 A1 | 12/2003 | Collins et al. | 156/345.49 |
| 2004/0107906 A1 | 6/2004 | Collins et al. | 118/723 |
| 2004/0107907 A1 | 6/2004 | Collins et al. | 118/723 |
| 2004/0107908 A1 | 6/2004 | Collins et al. | 118/723 |
| 2004/0107909 A1 | 6/2004 | Collins et al. | 118/723 |
| 2004/0112542 A1 | 6/2004 | Collins et al. | 156/345.48 |
| 2004/0149217 A1 | 8/2004 | Collins et al. | 118/723 |
| 2004/0149218 A1 | 8/2004 | Collins et al. | 118/723 |
| 2004/0166612 A1 | 8/2004 | Maydan et al. | 438/149 |
| 2004/0200417 A1 | 10/2004 | Hanawa et al. | 118/723 |
| 2005/0051271 A1 | 3/2005 | Collins et al. | 156/345.31 |
| 2005/0051272 A1 | 3/2005 | Collins et al. | 156/345.48 |
| 2005/0070073 A1 | 3/2005 | Al-Bayati et al. | 438/460 |
| 2005/0136604 A1 | 6/2005 | Al-Bayati et al. | 438/301 |
| 2005/0191827 A1 | 9/2005 | Collins et al. | 438/513 |
| 2005/0191828 A1 | 9/2005 | Al-Bayati et al. | 438/514 |
| 2005/0191830 A1 | 9/2005 | Collins et al. | 438/513 |
| 2005/0230047 A1 | 10/2005 | Collins et al. | 156/345.33 |
| 2006/0043065 A1 | 3/2006 | Buchberger et al. | 216/63 |
| 2006/0073683 A1 | 4/2006 | Collins et al. | 438/510 |
| 2006/0081558 A1 | 4/2006 | Collins et al. | 216/67 |
| 2007/0042580 A1 | 2/2007 | Al-Bayati et al. | 438/530 |
| 2007/0119546 A1 | 5/2007 | Collins et al. | 156/345.48 |
| 2007/0212811 A1 | 9/2007 | Hanawa et al. | 438/104 |
| 2008/0044960 A1 | 2/2008 | Al-Bayati et al. | 438/156 |
| 2008/0173641 A1 | 7/2008 | Hadidi | |
| 2009/0064716 A1* | 3/2009 | Sakamoto | C03B 1/02 65/33.1 |
| 2009/0149028 A1 | 6/2009 | Marakhtanov et al. | 438/710 |
| 2010/0044477 A1 | 2/2010 | Foret | 241/5 |
| 2011/0300029 A1 | 12/2011 | Foret | 422/186.21 |
| 2012/0125052 A1 | 5/2012 | Dong | 65/136.3 |
| 2012/0187844 A1 | 7/2012 | Hoffman et al. | 315/111.51 |
| 2012/0321527 A1 | 12/2012 | Gutsol et al. | 422/186.23 |
| 2012/0321895 A1* | 12/2012 | Ueda | C01B 33/14 428/402 |
| 2013/0118589 A1 | 5/2013 | Hu et al. | 137/1 |
| 2013/0126332 A1 | 5/2013 | Foret | 204/157.43 |
| 2013/0126485 A1 | 5/2013 | Foret | 219/121.36 |

FOREIGN PATENT DOCUMENTS

| | | |
|---|---|---|
| EP | 1 831 425 | 7/2011 |
| EP | 2 424 336 | 2/2012 |
| EP | 2 256 781 | 12/2012 |
| JP | 03-064182 | 5/2000 |
| JP | 2013082591 A | 5/2013 |
| WO | 2006/078340 | 7/2006 |

OTHER PUBLICATIONS

C. Huang, et al., "Low-Temperature Cyclonic Plasma Created at Atmospheric Pressure", *IEEE Transactions on Plasma Science*, Jul. 2009, vol. 37, No. 7, pp. 1169-1171.

L. Lie, et al., "Characteristics of Gliding Arc Discharge Plasma", Plasma Science & Technology, Nov. 2006, vol. 8, No. 6, pp. 653-655.

PCT/US2015/022982 Search Report Dated Jun. 24, 2015.

M. Boulos, "Plasma Power can make better powders", *Metal Powder Report*, May 2014, pp. 16-21.

J. Laimer, et al., "Characterization of an Atmospheric Pressure Radio-Frequency Capacitive Plasma Jet", *Plasma Processes and Polymers*, 2007, vol. 4, pp. S487-S492.

J. Laimer, et al., "Investigation of an atmospheric pressure radio-frequency capacitive plasma jet", *Vacuum Surface Engineering, Surface Instrumentation & Vacuum Technology*, 2005, vol. 79, pp. 209-214.

J. Park, et al., "Discharge phenomena of an atmospheric pressure radio-frequency capacitive plasma source", *Journal of Applied Physics*, Jan. 1, 2001, vol. 89, No. 1, pp. 20-28.

J. Park, et al., "Gas breakdown in an atmospheric pressure radio-frequency capacitive plasma source", *Journal of Applied Physics*, Jan. 1, 2001, vol. 89, No. 1, pp. 15-19.

J.R. Roth, et al., "The physics and phenomenology of One Atmosphere Uniform Glow Discharge Plasma (OAUGDP™) reactors for surface treatment applications", *Journal of Physics D: Applied Physics*, 2005, vol. 38, pp. 555-567.

J.R. Roth, "Capacitive RF Electrical Discharges in Gases", *Industrial Plasma Engineering*, vol. 1, Copyright IOP Publishing Ltd 1995, Principles, pp. 440-461.

J.R. Roth, "Atmospheric Dielectric Barrier Discharges (DBDS)", *Industrial Plasma Engineering*, vol. 2, Copyright IOP Publishing Ltd 2001, Applications to Nonthermal Plasma Processing, pp. 50-65.

J.H. Seo, et al., "Direct synthesis of nano-sized glass powders with spherical shape by RF (radio frequency) thermal plasma", *Thin Solid Films*, 2011, vol. 519, pp. 7111-7115.

\* cited by examiner

METHODS AND APPARATUS FOR MATERIAL PROCESSING USING DUAL SOURCE CYCLONIC PLASMA REACTOR

BACKGROUND

The present disclosure relates to methods and apparatus for material processing using a dual source, cyclonic, thermal plasma reactor.

Glass substrates may be used in a variety of applications, including windows, high-performance display devices, and any number of other applications. The quality requirements for glass substrates have become more stringent as the demand for improved resolution, clarity, and performance increases. Glass quality may, however, be negatively impacted by various processing steps, from forming the glass melt to final packaging of the glass product.

One processing step that may result in reduced glass quality is the melting process, wherein the components of a glass batch material are mixed and heated in a melting apparatus. During this process, the components of the glass batch material melt and react, giving off reaction gases, which produce bubbles in the molten glass. Additionally, the melting process may produce an inhomogeneous glass melt having regions of differing chemical compositions. The first melt to form is often highly reactive with the refractory materials, which may lead to excessive wear of the apparatus and/or defects in the glass melt. Denser portions of the melt may also sink to the bottom of the melting apparatus, leading to a sludge layer, which may have different optical properties than the rest of the melt and is difficult to completely mix back into the overall melt. The sludge layer therefore results in inhomogeneous portions of the melt, referred to in the art and herein as chord. Finally, due to typically large processing volumes, it is possible that various glass batch materials may not completely melt. Any un-melted or partially melted materials are carried through the melting process and may later become defects in the glass product.

Current melting processes for producing high quality optical glass utilize high temperatures and stirring to remove bubbles from the glass melt. However, such processes may be cost prohibitive, as they require expensive metals and specially-designed high temperature refractory materials for the processing equipment. Further, these costly melting systems require a long processing time and high energy expenditure as the reaction gases have a long distance to travel to escape the glass melt and the sludge layer must be mixed from the bottom of the melter tank into the rest of the glass melt in the tank, requiring a mixing motion over a long distance through a highly viscous fluid.

Alternative methods for preventing glass bubbles and inhomogeneous portions in the glass melt include processing the melt in smaller batches. In this manner, the gas bubbles have a shorter distance to travel to escape the melt and the sludge layer can be more easily incorporated into the rest of the melt. However, as with many small scale processes, these methods have various drawbacks such as increased processing time and expense.

Accordingly, there are needs in the art for techniques to improve the melting processes of glass batch materials for producing high quality optical glass.

SUMMARY

The present disclosure relates to material processing (for example, glass batch material) by means of atmospheric thermal plasma in which the material to be processed is dispensed as a flow of material particles into a plasma plume that is of a generally cylindrical configuration.

In order to produce the plasma plume, at least first and second sources of electromagnetic fields are provided to a plasma gas, such that the plasma plume attains an electron temperature of at least 9,000 K, for example, 11,603 K (i.e., $1.602 \times 10^{-19}$ J or 1 eV). The charged particles of the plasma gas are accelerated by the electromagnetic fields in order to produce ionization and give momentum and kinetic energy to ions and electrons in the plasma gas. When the ions and electrons collide with the material (for example, glass batch material in powder form) the kinetic energy is transferred to the material. The transfer of the kinetic energy raises the internal temperature of the material to the point where there is a thermal reaction (for example, partial melting, full melting, and/or cause some other or further reaction).

For commercial purposes, it is important that the atmospheric thermal plasma process exhibits high throughput and sufficient thermal energy to achieve the desired thermal reaction(s).

Inductively coupled plasma (ICP) systems have been used for low pressure sputtering and etching systems on substrates. Inductively coupled atmospheric plasma material processing systems are generally constructed with small diameter coils or microwave waveguides which limit the plasma to a small volumetric column (typically about 5 mm in diameter). Even if such a system employs a relatively high power RF source (e.g., about 400 kW), at a very high equipment cost, only a low rate (e.g., 20-40 kg per hour) of particulate material may be processed through the plasma. In the glass batch processing context, practical production rates are at least one metric ton per day, which would barely be met using the conventional ICP system at peak production twenty four hours a day. In order to address the shortcomings of the processing rate, multiples of the equipment set up, energy, and maintenance costs would be required.

Another problem with the conventional ICP system is a limit on the permissible input particle sizes, typically about 90 um or less. The free fall characteristics of such small particles in the ICP plasma system are such that sufficient heating of the particles may be achieved within a period of about 300 ms or less. If the particles were larger, and did not absorb enough heat to melt, then the once through-processed particles would have to be recycled through the system again, thereby reducing the throughput rate even further.

The time that the particles are within the plasma plume is known in industry as residence time. The greater the residence time, the more time there is for the particles to absorb heat. The more residence time permits larger particles to be processed. If particles up to 1000 um (or more) could remain in the plasma plume for sufficient residence time (e.g., greater than 300 ms, such as one second or more), then the quantity of material processed per unit of time would be far greater than is attainable in the aforementioned ICP system, and may be capable of meeting practical production demands.

Capacitively coupled plasma (CCP) systems have been used for low pressure reactive processing, sputtering, PECVD processes, thin film PVD, etc. in which solid substrates are treated. Capacitively coupled plasma systems have also been used with concentric tubes acting as separate capacitor plates, which produce small columnar plasma volumes (again about 5 mm in diameter) and resultant low particulate material processing rates. An atmosphere uniform glow discharge plasma system has been employed in which a parallel capacitive plate arrangement produced atmospheric plasma, however, with essentially no heating as part of the process.

Efforts have been made in the art for increasing the residence time for particles being processed in a plasma plume. For example, a rotation of the plasma gas in a swirl has been attempted using two tangentially, and oppositely oriented, DC hollow cathode plasma torches. The swirl tends to maintain the particles in the plasma plume for a controllable period of time. In such a system, the residence time may be predicted as the particles traverse a longer, spiral path through the plasma plume (as opposed to a straight free fall path). A significant problem with the use of the hollow cathode plasma torches is that respective coils must be wrapped around the cathodes, and the cathodes must be heated to incandescence, thereby producing thermionic emission of electrons. The electrons produce a stream toward the anode and away from the cathodes. As the plasma gas (e.g., argon) is blown through the cathodes and across the anode, ionization and plasmatization of the argon is produced, which results in the decomposition of the cathodes and anode, which contaminates the plasma plume and, in turn, contaminates the melt. Additional problems with the aforementioned cyclonic plasma system include a lack of thermal control of the plasma temperature and the thermal profile of the plasma plume throughout the reactor, resulting in an uneven and turbulent characteristic. As the particles lose momentum in the plasma plume, they may easily spin into and out of hot zones and therefore heat unevenly.

One or more embodiments disclosed herein provide thermally uniform and low turbulence plasma by providing a controllable plasma temperature substantially evenly within the plume. Thus, particles experience a uniform plasma density throughout the reactor as they move cyclonically toward the outlet with a longer residence time as compared with free fall inductively coupled plasma systems.

By way of example, one or more embodiments may employ a plasma reactor in which no electrodes or inductive components are disposed in the plasma environment, thereby avoiding the decomposition of such elements and the resultant contamination of the plasma plume. The embodiments may employ a plasma containment vessel of a generally cylindrical configuration defining a generally cylindrical inner volume with a vertically oriented central axis. A radio frequency (RF) capacitive dual ring arrangement is disposed around the plasma containment vessel, where a first ring electrode is at ground potential and a second ring electrode is at an RF potential. An RF source provides relatively high frequency power to the first and second ring electrodes, such as at least 1 MHz, and preferably between about 1 to 50 MHz. The two ring electrodes produce an electromagnetic field having field lines that traverse the inner volume generally in the direction of the central axis of the plasma containment vessel. A tangential plasma gas inlet is located at an upper end of the plasma containment vessel and a tangential plasma gas outlet is located at an opposite, lower end of the plasma containment vessel. The plasma gas is introduced through the inlet at a relatively high velocity to produce a cyclone of gas in the inner volume of the plasma containment vessel, which rotates about the vertical axis. As the plasma gas spins, the plasma gas encounters the electromagnetic field lines produced by the first and second ring electrodes, thereby producing ionization and plasmatization.

In addition, the plasma containment vessel may include a centrally disposed inner chamber, which defines a hermetically-sealed space in which an induction coil is disposed. The induction coil is driven via a relatively low frequency power source, such as about 10 kHz to about 250 KHz. The induction coil is not exposed to the plasma environment by virtue of its location within the hermetically sealed space. The induction coil increases the thermal energy of the plasma gas within the plasma containment vessel by inducing a large circulating current in the cyclone plasma gas. The current superheats the plasma gas via ohmic (resistive) and/or joule heating. The temperature of the plasma plume may be controlled by adjusting the current through the induction coil.

Notably, the respective electromagnetic fields from the ring electrodes and the induction coil are used in conjunction. The RF energy from the RF electromagnetic field is used to ignite and sustain the plasma plume, and the low frequency energy from the induction coil is used to controllably increase/decrease the temperature of the plasma plume. As the material (e.g., glass batch material) is introduced into the upper end of the plasma containment vessel, the material is influenced by the cyclone of the plasma gas to spin around the central axis. The material loses momentum over time and swirls toward the lower end of the plasma containment vessel, where the reacted material is expelled through an outlet. The reacted material may be cooled (i.e., quenched) and collected.

The embodiments disclosed herein overcome the low particulate material processing rates of existing systems in order to provide industrial scale applications. Embodiments provide high volumes of plasma at atmospheric pressures, and produce adequate kinetic energy within the plasma plume to heat the material and achieve desired reactions, including melting and/or other thermally-based processes.

Other aspects, features, and advantages will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the embodiments disclosed and described herein are not limited to the precise arrangements and instrumentalities shown.

DETAILED DESCRIPTION OF THE PREFERRED EMBODIMENTS

Figure 1:
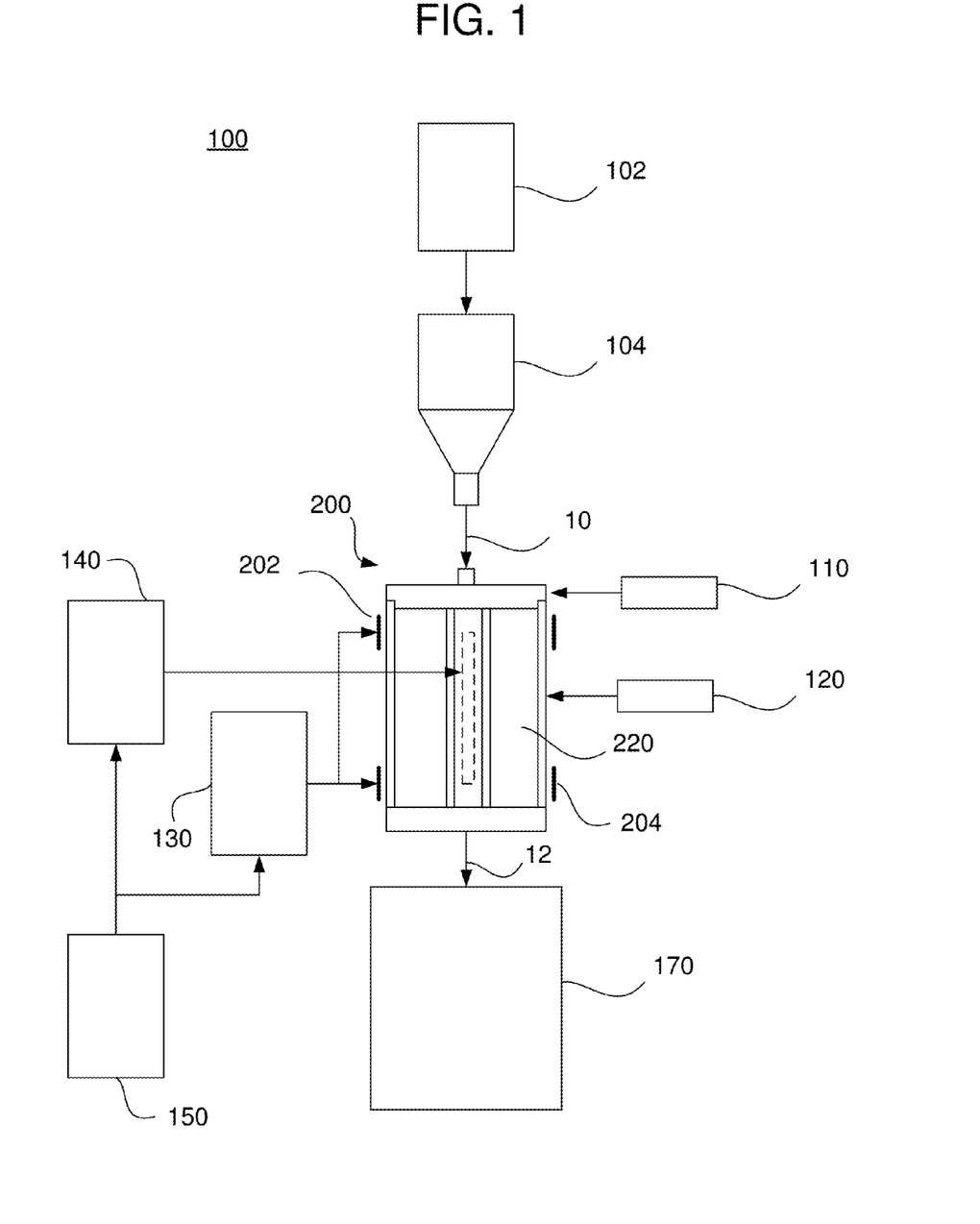
FIG. 1 is a schematic illustration of a system for melting glass batch material according to one or more embodiments of the present disclosure.

With reference to the drawings wherein like numerals indicate like elements there is shown in FIG. 1 a system 100 for processing material using a plasma thermal source. The material may be of a generally particulate form, and may be any suitable material, for example glass batch material.

The phrase glass batch material, and variations thereof, is used herein to denote a mixture of glass precursor particles which, upon melting, reacting and/or other action, combine to form a glass material. The glass batch material may be prepared and/or mixed by any known method for combining the glass precursor particles. For example, in certain non-limiting embodiments, the glass batch material comprises a dry or substantially dry mixture of glass precursor particles, e.g., without any solvent or liquid. In other embodiments, the glass batch material may be in the form of a slurry, for example, a mixture of glass precursor particles in the presence of a liquid or solvent. According to various embodiments, the glass batch material may comprise glass precursor materials, such as silica, alumina, and various additional oxides, such as boron, magnesium, calcium, sodium, strontium, tin, or titanium oxides. For instance, the glass batch material may be a mixture of silica and/or alumina with one or more additional oxides. One skilled in the art will appreciate that the glass batch material may take on a wide variety of specific combinations of compounds and substances.

Figure 2:
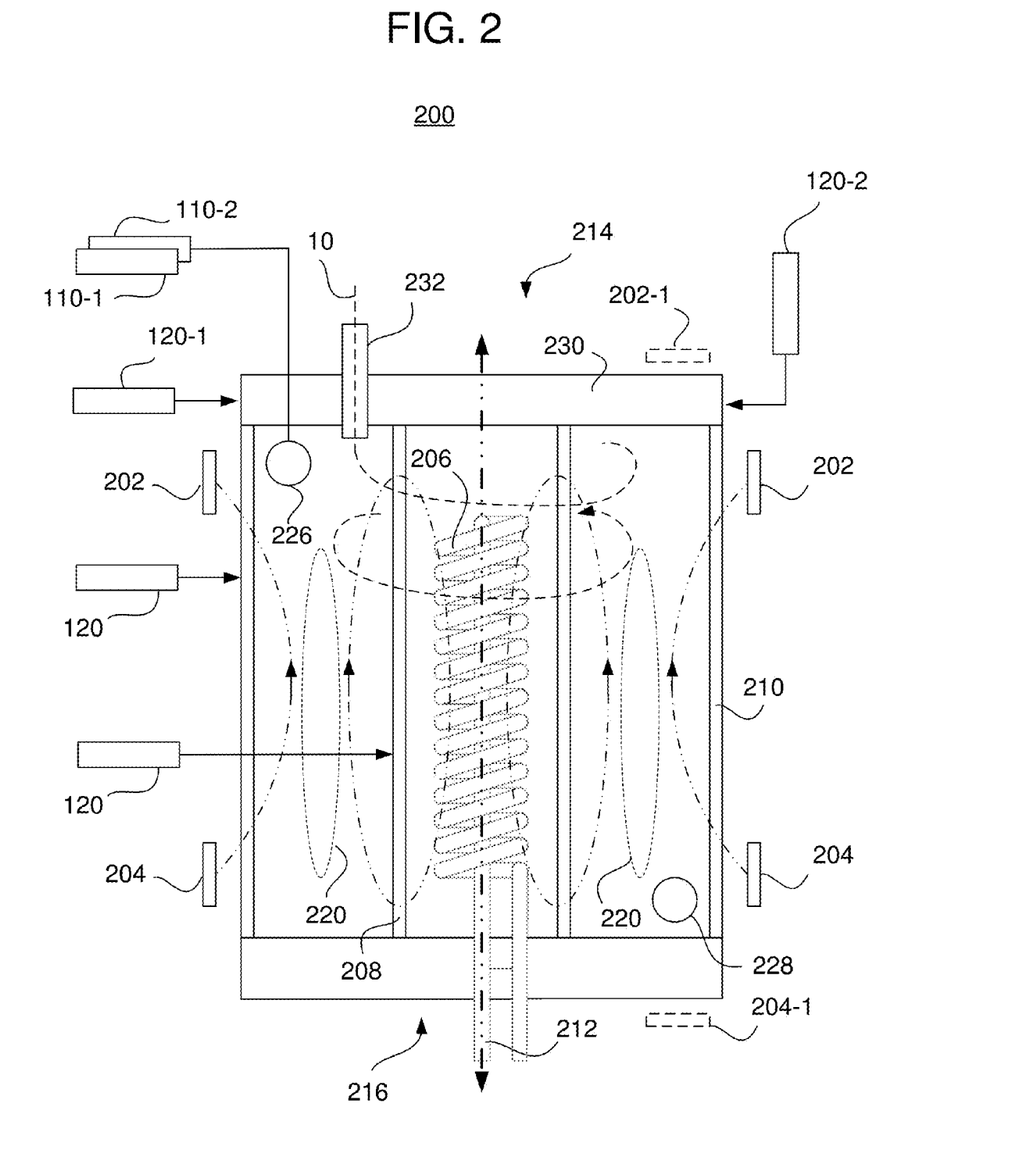
FIG. 2 is a side, schematic illustration, of one or more embodiments of a plasma containment vessel usable in the system of FIG. 1 and/or other embodiments.
Figure 3:
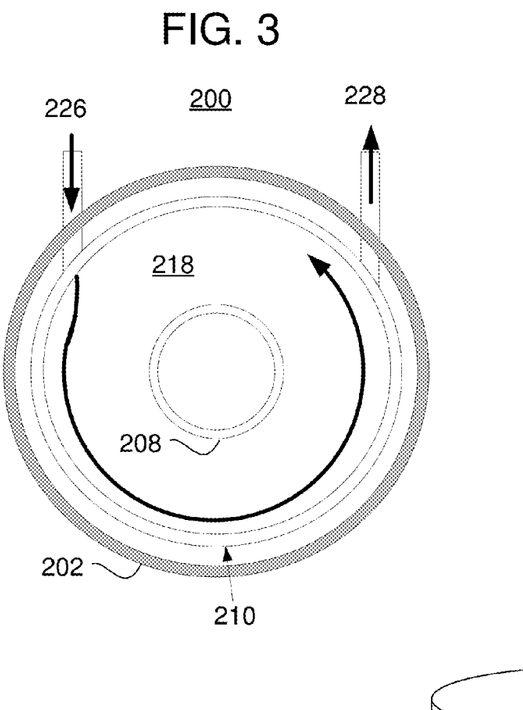
FIG. 3 is a top, schematic illustration, of the plasma containment vessel of FIG. 2 and/or other embodiments.
Figure 4:
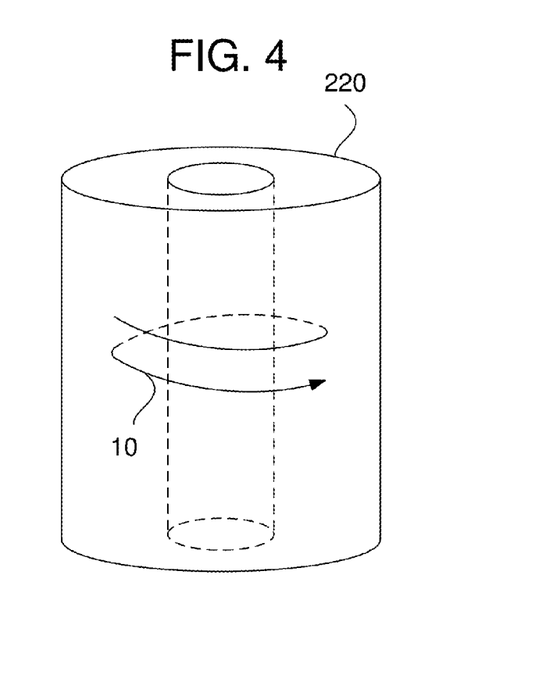
FIG. 4 is a schematic illustration of a plasma plume produced within the plasma containment vessel of FIG. 2 and/or other embodiments.

A detailed discussion of the system 100 will now be provided with reference to FIGS. 1-4. FIGS. 2-3 are side and top schematic illustrations, respectively, of one or more embodiments of the plasma containment vessel 200, and FIG. 4 is a perspective, schematic view of a plasma plume produced within the plasma containment vessel 200.

With reference to FIG. 1, the glass precursor particles may be introduced into a batch feeder and/or mixer 102, where the particles are mixed, followed by feeding the mixed particles into a batch sifter 104, where any agglomerates are broken up. The glass batch material 10 may have an average particle size of at least one of: (i) at least about 10 um, (ii) at least about 50 um, (iii) at least about 75 um, (iv) at least about 100 um, (v) at least about 150 um, (vi) at least about 200 um, (vii) at least about 500 um, (viii) at least about 750 um, (ix) at least about 1000 um, and (x) from about 5 to about 1000 um. The glass batch material 10 (the flow of which is illustrated the arrows labeled 10 and 12) leaves the batch sifter 104 and enters the plasma containment vessel 200. The glass batch material 10 is exposed to a plasma plume 220 within the plasma containment vessel 200, whereby the plasma plume 220 is of sufficient thermal energy to cause at least a thermal reaction of the glass batch material 10 to produce thermally reacted glass batch material 12.

Examples of the types of thermal reactions contemplated herein include, at least one of: (i) at least partially melting the glass batch material 10 to produce the thermally reacted glass batch material 12, (ii) at least partially melting at least one of the glass batch material and one or more further materials thereby forming coated glass batch material particles 12, and (iii) at least partially melting the glass batch material to form substantially homogeneous, spheroid-shaped glass intermediate particles 12. Those skilled in the art will appreciate that the types of thermal reactions (and/or other reactions) within the plasma containment vessel 200 may include any number of additional reactions as would be evident from the state of the art. By way of example, the glass batch may be at least partially melted with a further material that comprises silver, copper, tin, silicon or another semiconductor material, including the respective metal or metal oxide, etc. to form coated glass batch material particles. Glass particles coated with silver or copper, for instance, may have antibacterial properties, and glass particles coated with tin oxide may be photoactive.

In order to facilitate the plasma plume 220 within the plasma containment vessel 200 one or more sources of plasma gas 110 are coupled to the vessel 200. One or more sources of cooling fluid 120 (such as air, water, etc.) may also be coupled to the plasma containment vessel 200 in order to control the temperature of the structure in the presence of the plasma plume 220.

As will be described in greater detail herein, the plasma gas is subject to first and second electromagnetic fields. The first electromagnetic field is produced by way of a RF power source 130 (which may include an impedance matching network), which drives first and second ring electrodes 202, 204 to establish an electric field therebetween. The second electromagnetic field is produced by way of an AC power source 140, which drives an induction coil 206. A control unit 150 (such as a microprocessor operating under the influence of a software program) may provide signaling to the RF power source 130, the AC power source 140, and/or the one or more sources of plasma gas 110 in order to influence certain characteristic of the plasma plume 220 and certain characteristics of the particle dynamics within the plasma plume 220. With proper settings of the aforementioned components, the plasma plume 220 may achieve sufficient energy to cause the desired level of thermal reaction in the glass batch material 10.

The thermally reacted glass batch material 12 is accumulated in a collection vessel 170. After collection, the thermally reacted glass batch material 12 may be subjected to additional and/or optional processing steps.

With reference to FIGS. 2-4, the plasma containment vessel 200 includes at least one wall member 210 defining an inner volume 218 having a central axis 212, an inlet end 214, and an opposing outlet end 216. In a preferred embodiment, the at least one wall member 210 is in the form of a cylinder, thereby defining a cylindrically shaped inner volume 218. A hermetically sealed chamber is formed from at least one further wall member 208 disposed within the inner volume 218 of the plasma containment vessel 200, preferably centrally located. As will be discussed in more detail later herein, the induction coil 206 is disposed within the hermetically sealed chamber.

The wall members 208, 210, may be formed from a suitable non-conductive, non-corrosive, high temperature, dielectric material, such as high temperature ceramic materials, preferably with an ultra-low coefficient of thermal expansion, e.g., a coefficient of thermal expansion of less than $10 \times 10^{-7}/°C.$, such as fused quartz, which has a coefficient of thermal expansion of $5.5 \times 10^{-7}/°C.$ over the range of 20° C. to 320° C. In order to permit cooling of one or more components of the plasma containment vessel 200, one or more (and preferably both) of the wall members 208, 210 may include one or more internal channels operating to carry cooling fluid therethrough. In this regard, the internal channels may be accessed via respective inlet/outlets (not shown) that are in fluid communication with the one or more sources of cooling fluid 120.

The plasma containment vessel 200 may also include an inlet structure 230 disposed at the inlet end thereof. The basic purpose of the inlet structure 230 is to receive the glass batch material 10 from the supply, such as the batch sifter 104, and to direct the material 10 into the inner volume 218 of the plasma containment vessel 200 so that it may be enveloped by the plasma plume 220. The inlet structure 230 may be formed from any suitable material, such as a non-magnetic alloy, for example brass, copper, stainless steel, etc.

The inlet structure 230 may include at least one gas inlet 226 for receiving plasma gas from the one or more sources of plasma gas 110. As will be discussed in more detail hereinbelow, the plasma gas may include at least one of argon, air, helium, nitrogen, oxygen, and mixtures thereof. In one or more embodiments, the at least one gas inlet 226 may be employed to receive one or more types of plasma gas from one or more first sources 110-1 and to receive one or more types of plasma gas from one or more second sources 110-2. The at least one gas inlet 226 is sized, shaped, and oriented to dispense the plasma gas into the inlet end 214 of the inner volume 218 such that the plasma gas is directed tangentially to the central axis 212. The inlet structure 230 may also include at least one gas outlet 228, disposed in proximity to the outlet end 216 for egress of the plasma gas.

The at least one gas inlet 226 and the at least one gas outlet 228 are sized, shaped, and oriented such that the plasma gas swirls through the inner volume 218 in cyclonic, swirling fashion. As shown in FIGS. 2-3, the gas inlet 226 is placed at the upper end of the plasma containment vessel 200 and in a tangential orientation to the arcuate cross section of the inner volume 218. Similarly, the outlet 228 is placed at the lower end of the plasma containment vessel 200, also in a tangential orientation to the arcuate cross section of the inner volume 218. Due to the geometry of the wall member 210 and the configuration of the inlet 226 and outlet 228, the plasma gas is forced in a substantially circular, cyclonic motion which then exhausts through the outlet 228.

The inlet structure 230 may also include a material inlet 232 for receiving the glass batch material 10 into the plasma containment vessel 200. The material inlet 232 is disposed proximate to the inlet end 214 of the plasma containment vessel 200 and is sized, shaped, and oriented in order to dispense the glass batch material 10 proximate to the inlet end 214 of the inner volume 218. The material inlet 232 may be in the form of a flange, collar, tube, etc. in order to mate with a conduit (not shown) of complimentary size and shape from the batch sifter 104 (or other supply). Preferably, the material inlet 232 is oriented such that the glass batch material is dispensed generally parallel to the central axis 212 of the plasma containment vessel 200 and/or transverse to the plasma gas entering the inner volume 218 tangentially to the central axis. This ensures that the glass batch material 10 swirls about the plasma plume 220.

The inlet structure 230 may also include one or more internal channels operating to carry fluid therethrough in order to cool the inlet structure 230 in the presence of the plasma plume 220. In this regard, the internal channels may be accessed via respective inlet/outlets (not shown) that are in fluid communication with the one or more sources of cooling fluid 120-1, 120-2. The outlets permit egress of warmed fluid for recirculation back to the cooling fluid source(s) 120 or disposal.

The plasma containment vessel 200 may also include the first and second ring electrodes 202, 204 disposed annularly about an exterior of the at least one wall member 210 of the plasma containment vessel 200. The first and second electrodes 202, 204 are formed from a conductive material, such as copper, which may be plated with another conductive material, such as silver, gold, etc. The first ring electrode 202 is disposed annularly about the inlet end 214, and the second ring electrode 204 is disposed annularly about the outlet end 216. As illustrated by the elements labeled 202, 202-1, 204, and 204-1 there are a number of orientations available for placement of the ring electrodes. As mentioned above, the first and second ring electrodes 202, 204 are operable to receive RF power having characteristics sufficient to produce the first electromagnetic field. In particular, the first electromagnetic field has field lines running between the first and second ring electrodes 202, 204 and generally parallel to the central axis 212 of the plasma containment vessel 200. As the at least one wall member 210 is formed from a dielectric material and the inner volume 218 is at atmospheric conditions (also dielectric), the combination results in a capacitive structure.

The first and second ring electrodes 202, 204 receive the RF power from the RF power source 130 (and impedance matching network), where the RF power has certain frequency and power characteristics. For example, the RF power may be at a frequency of such that the first electromagnetic field exhibits a frequency of at least one of: (i) at least 1 MHz, (ii) at least 3 MHz, (iii) at least 4 MHz, (iv) at least 5 MHz, (v) at least 10 MHz, (vi) at least 15 MHz, (vii) at least 20 MHz, (viii) at least 30 MHz, (ix) at least 40 MHz, and (x) between about 1 to 50 MHz. The RF power may be at a power level from 5 kW to 1 MW (or other suitable power level).

As discussed briefly above, the induction coil 206 is disposed along the central axis 212 of the plasma containment vessel, and is operable to receive AC power from the AC power source 140. The characteristics of the AC power are sufficient to produce the second electromagnetic field having field lines running through a core of the induction coil 206, and through the inner volume 218 generally parallel to the central axis 212 of the plasma containment vessel 200. The AC power may be of a characteristic such that the second electromagnetic field exhibits a frequency of at least one of: (i) at least 10 kHz, (ii) at least 15 kHz, (iii) at least 20 kHz, (iv) at least 30 kHz, (v) at least 40 kHz, (vi) at least 50 kHz, (vii) at least 100 kHz, (viii) at least 150 kHz, (ix) at least 200 kHz, and (x) between about 10 to 250 kHz. The AC power may be at a power level from 5 kW to 1 MW (or other suitable power level).

As illustrated in FIG. 4, the plasma plume 220 may be of a substantially cylindrical shape (although not perfectly cylindrical), and may be of sufficient thermal energy to cause the glass batch material to thermally react. For example, when the characteristics of the first and second electromagnetic fields are sufficiently established, the plasma plume 220 may exhibit a relatively uniform temperature ranging from at least one of: (i) about 9,000 K to about 18,000 K; (ii) about 11,000 K to about 15,000 K; and (iii) at least about 11,000 K. Notably, the plasma plume 220 is advantageously at atmospheric pressure, whereby the plasma plume 220 may be characterized as an atmospheric pressure thermal plasma jet.

In order to ignite the plasma gas at atmospheric pressure, at least one plasma gas (e.g., argon) may be introduced to approximately 10 Torr into the inner volume 218 and then the RF power may be applied to the first and second ring electrodes 202, 204. The argon should self-ignite under the RF electromagnetic field and the argon may be employed to take the plasma to a suitable electron temperature.

After ignition, the AC power is supplied to the induction coil 206, which induces eddy currents in the plasma gas, which significantly increases the energy and temperature of the plasma plume 220. More particularly, the induction coil 206 is positioned such that the magnetic flux is concentrated external to the induction coil 206 and in the region where the plasma gas swirls. As the ignited plasma gas becomes a highly ionized conductive gas, the magnetic flux from the induction coil 206 cuts across the ignited plasma gas and causes a shorted current to flow in a substantially circular path through the plasma gas, thereby forming a concentrated, toroidal ring of highly energized electrons. The magnetic flux in the plasma plume (and the plasma current) from the induction coil 206 is directly proportional to the current flowing in the induction coil 206 from the AC source. Thus, the temperature of the plasma plume is directly proportional to the AC power level.

After the plasma plume 220 reaches a sufficiently high temperature, nitrogen may be introduced, and the plasma plume 220 dissociates the molecular bonds between the two nitrogen atoms. The purpose of adding nitrogen atoms to the plasma gas is to increase thermal conduction of the plasma gas, which in turn allows more process particle heating at a faster rate. Additionally or alternatively, oxygen may be introduced in relatively small amounts if there is a desire to burn off excess carbon (as may be the case when there are polymer elements in the batch materials). In embodiments, the $N_2$ (or $O_2$) flow rate ranges from 0.5 to 2 slpm such that the ratio of $N_2$ (or $O_2$) to Ar is 1.25% to 5% by volume.

As mentioned above, the system 100 provides control over various characteristics of the plasma plume 220 and the movement of the glass batch material 10 through the plasma. For example, the control unit 150 may operate to adjust a pressure and/or flow rate of the one or more sources of plasma gas 110 in order to control one or more characteristics of cyclonic swirling of the plasma gas through the inner volume 218, thereby controlling a residence time of the glass batch material 10 within the plasma plume 220 Additionally or alternatively, the control unit 150 may operate to control a power level of the AC power from the source 140, to thereby control an intensity of the second electromagnetic field, and to thereby control a temperature of the plasma plume 220. The control unit 150 may additionally or alternatively control the power level of the RF power from the source 130 in order to influence the temperature of the plasma plume 220.

When the plasma plume has been brought to temperature, the glass batch material 10 is inserted tangentially (in this example vertically) into the swirling plasma plume. The velocity and drag of the plasma gas captures the glass batch material 10 and spins it with centrifugal force. At each revolution of the glass batch material 10 about the inner volume 218, the momentum of the particles therein decreases and the particles revolve at lower positions within the volume 218, and at increasing orbital paths, until the outlet is reached. As the glass batch material 10 swirls within the plasma plume, the particles thereof are impacted by the charged plasma particles (ions and electrons), and thereby the particles of the glass batch material 10 receive high kinetic energy from the charged particles. The glass batch material 10 absorbs the kinetic energy and at some point begins to thermally react.

If given too much time in the plasma plume (i.e., absorbing too much kinetic energy), the glass batch material may overreact, such as by melting, vaporizing, and elementally dissociating. As noted above, the velocity of the plasma gas may be adjusted to modify the residence time and to thereby control the depth of thermal radiation into the glass batch material 10. If only a surface modification of the material 10 is desired, then a reduced residence time would be called for so as not to allow complete penetration of thermal energy into the particles of the material 10. If reactive chemistry is desired, or complete melting of the particles is desired, then longer residence times may be accomplished by increasing the velocity of the plasma gas and/or by increasing the distance between the inlet 226 and the outlet 228 nozzles. The length of the plasma containment vessel 200 (i.e., in the direction of the central axis) may be increased and filled with a larger volume of plasma to increase residence time.

Once the glass batch material 10 has reached the outlet 228, it may be rapidly quenched by a cool gas jet (not shown) and then received by the collection device 170.

Figure 5:
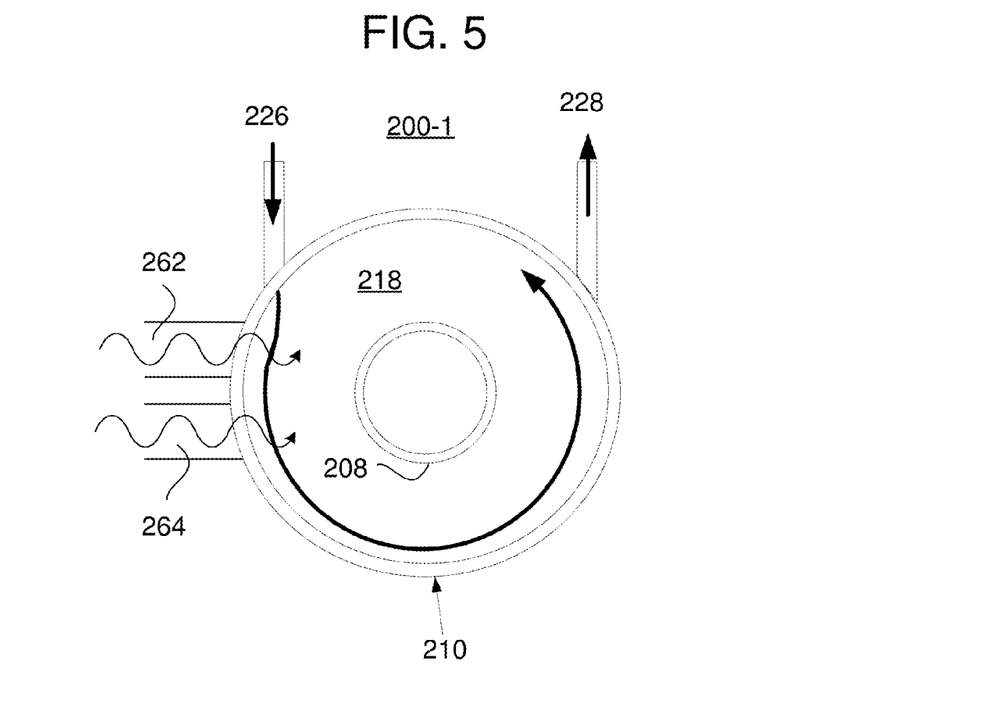
FIG. 5 is a top, schematic illustration, of a plasma containment vessel of an alternative embodiment.
Figure 6:
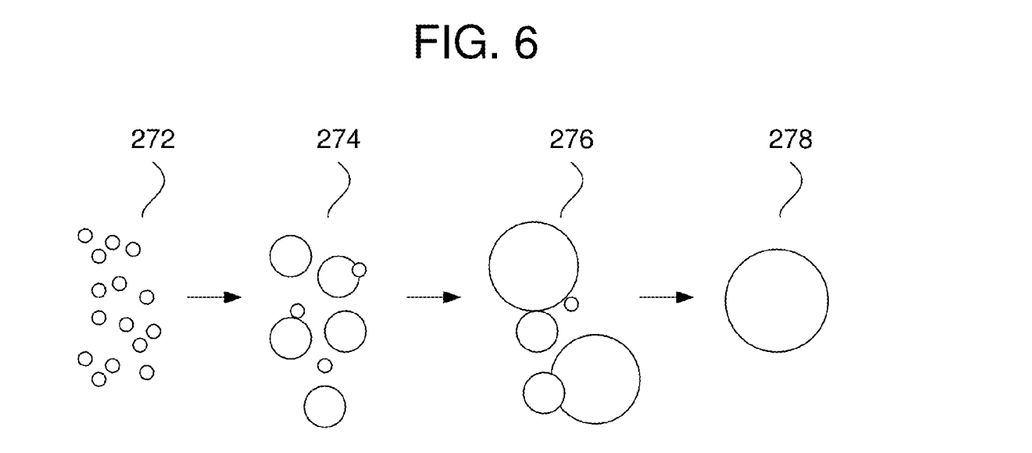
FIG. 6 is a schematic illustration of a number of compounds within the plasma containment vessel of FIG. 5 being subject to thermal processing.

Reference is now made to FIGS. 5-6, where the former is a top, schematic illustration of a plasma containment vessel 200-1 of an alternative embodiment, and the latter is a schematic illustration of a number of compounds within the plasma containment vessel 200-1 being subject to thermal processing. In many ways the plasma containment vessel 200-1 of FIG. 5 may be implemented in similar fashion as the plasma containment vessel 200 of FIGS. 1-4. There are, however, notable differences, including that the ring electrodes 202, 204 need not be employed and that the plasma containment vessel 200-1 employs one or more microwave sources (not shown) to produce one or more microwave signals 262, 264 that are introduced into the inner volume 218 of the vessel 200-1. The frequency of the microwave signals 262, 264 may be between about 2 GHz and about 10 GHz, and the power level may be about 2-10 kW.

The one or more microwave signals 262, 264 cooperate to maintain the plasma plume 220 within the volume 218. Since the plasma gas is moving at high velocity (with a high mass content) the microwave signals 262, 264 and the low frequency electromagnetic field produced by the induction coil 206 heat the plasma gas and create the plume 220. In such an arrangement, the individual compounds 272 may be introduced and processed within the plasma containment vessel 200-1 in order to melt, agglomerate, fuse, and boil off reactive gases. This process may reduce or eliminate any need for spray drying the individual compounds (and/or mixtures thereof) prior to introduction into the plasma containment vessel 200-1, which may significantly reduce the cost of the process. Indeed, in some instances, there are significant costs to pre-processing the compounds before introduction into a plasma reactor. For example, milling, creating a solvent-based slurry, agglomerating, adding a carbon based binder to hold the agglomerates together, and then spray drying.

As illustrated in FIG. 6, as the individual compounds 272 are introduced into the swirling currents of the plasma containment vessel 200-1, and the compounds 272 begin to heat, collide, agglomerate 274, fuse 276, and reactively melt. This process may produce a number of droplets 278 with representations of all of the desired compounds 272 therein. Other droplets may not have representations of all of the desired compounds 272, but rather a fraction of the desired compounds 272. As the droplets, the compounds 272, the agglomerates 274, and the fused compounds 276 continue to swirl, heat, collide, etc., droplets 278 of the desired combination of compounds 272 will continue to form. The droplets may then be treated and post-processed as discussed in connection with the other embodiments herein.

Although the disclosure herein has been described with reference to particular embodiments, it is to be understood that these embodiments are merely illustrative of the principles and applications of the embodiments herein. It is therefore to be understood that numerous modifications may be made to the illustrative embodiments and that other arrangements may be devised without departing from the spirit and scope of the present application.

The invention claimed is:

1. An apparatus, comprising:
    a plasma containment vessel having at least one wall member defining an inner volume having a central axis, an inlet end, and an opposing outlet end;
    an inlet structure disposed at the inlet end of the plasma containment vessel and including: (i) a material inlet for receiving glass batch material and dispensing the glass batch material proximate to the inlet end of the inner volume of the plasma containment vessel, (ii) at least one gas inlet for receiving one or more sources of plasma gas and dispensing the plasma gas into the inlet end of the inner volume such that the plasma gas is directed tangentially to the central axis, and at least one gas outlet for egress of plasma gas at the outlet end of the inner volume, the at least one gas inlet and at least one gas outlet being disposed such that the plasma gas swirls through the inner volume in cyclonic fashion; and
    first and second ring electrodes disposed annularly about an exterior of the at least one wall member of the plasma containment vessel, wherein: (i) the first ring electrode is disposed annularly about the inlet end and the second ring electrode is disposed annularly about the outlet end, and (ii) the first and second ring electrodes are operable to receive a source of RF power having characteristics sufficient to produce a first electromagnetic field having field lines running between the first and second ring electrodes and generally parallel to the central axis of the plasma containment vessel; and an induction coil disposed along the central axis of the plasma containment vessel, and operable to receive a source of AC power having characteristics sufficient to produce a second electromagnetic field having field lines running through a core of the induction coil, and through the inner volume generally parallel to the central axis of the plasma containment vessel, wherein the first electromagnetic field and the second electromagnetic field cooperate to form a plasma plume within the plasma containment vessel.

2. The apparatus of claim 1, wherein the plasma plume is of a substantially cylindrical shape, and is of sufficient thermal energy to cause the glass batch material to thermally react.

3. The apparatus of claim 1, wherein the RF power is of a characteristic such that the first electromagnetic field exhibits a frequency of at least one of: (i) at least 1 MHz, (ii) at least 3 MHz, (iii) at least 4 MHz, (iv) at least 5 MHz, (v) at least 10 MHz, (vi) at least 15 MHz, (vii) at least 20 MHz, (viii) at least 30 MHz, (ix) at least 40 MHz, and (x) between about 1 to 50 MHz.

4. The apparatus of claim 1, wherein the AC power is of a characteristic such that the second electromagnetic field exhibits a frequency of at least one of: (i) at least 10 kHz, (ii) at least 15 kHz, (iii) at least 20 kHz, (iv) at least 30 kHz, (v) at least 40 kHz, (vi) at least 50 kHz, (vii) at least 100 kHz, (viii) at least 150 kHz, (ix) at least 200 kHz, and (x) between about 10 to 250 kHz.

5. The apparatus of claim 1, wherein the induction coil is disposed within a hermetically sealed chamber located within the inner volume of the plasma containment vessel.

6. The apparatus of claim 1, further comprising a controller operating to control a power level of the AC power, to thereby control an intensity of the second electromagnetic field, and to thereby control a temperature of the plasma plume.

7. The apparatus of claim 1, wherein the plasma plume has a temperature ranging from one of: (i) about 9,000 K to about 18,000 K; (ii) about 11,000 K to about 15,000 K; and (iii) at least about 11,000 K.

8. The apparatus of claim 1, further comprising a controller operating to adjust a pressure and flow rate of the one or more sources of plasma gas in order to control one or more characteristics of cyclonic swirling of the plasma gas through the inner volume, thereby controlling a residence time of the glass batch material within the plasma plume.

9. The apparatus of claim 1, wherein the material inlet is oriented such that the glass batch material is dispensed generally parallel to the central axis of the plasma containment vessel and transverse to the plasma gas entering the inner volume tangentially to the central axis.

10. The apparatus of claim 1, wherein:
The inlet structure includes one or more internal channels operating to carry fluid therethrough in order to cool the inlet structure in the presence of the plasma plume;
the at least one wall member includes respective internal channels operating to carry fluid therethrough in order to cool the plasma containment vessel in the presence of the plasma plume; and
the induction coil is disposed within an hermetically sealed chamber formed by at least one inner wall member, the inner wall member including respective internal channels operating to carry fluid therethrough in order to cool the hermetically sealed chamber in the presence of the plasma plume.

11. The apparatus of claim 1, wherein the plasma gas includes at least one of argon, air, helium, nitrogen, oxygen, and mixtures thereof.

12. The apparatus of claim 1, wherein the thermally reacted glass batch material exit the plasma containment vessel through the outlet end.

13. A method, comprising:
providing a plasma containment vessel having at least one wall member defining an inner volume having a central axis, an inlet end, and an opposing outlet end;
providing an inlet structure disposed at the inlet end of the plasma containment vessel and including: (i) a material inlet for receiving glass batch material and dispensing the glass batch material proximate to the inlet end of the inner volume of the plasma containment vessel, (ii) at least one gas inlet for receiving one or more sources of plasma gas and dispensing the plasma gas into the inlet end of the inner volume such that the plasma gas is directed tangentially to the central axis, and at least one gas outlet for egress of plasma gas at the outlet end of the inner volume, the at least one gas inlet and at least one gas outlet being disposed such that the plasma gas swirls through the inner volume in cyclonic fashion; and
providing first and second ring electrodes disposed annularly about an exterior of the at least one wall member of the plasma containment vessel, wherein: (i) the first ring electrode is disposed annularly about the inlet end and the second ring electrode is disposed annularly about the outlet end, and (ii) the first and second ring electrodes are operable to receive a source of RF power having characteristics sufficient to produce a first electromagnetic field having field lines running between the first and second ring electrodes and generally parallel to the central axis of the plasma containment vessel; and
providing an induction coil disposed along the central axis of the plasma containment vessel, and operable to receive a source of AC power having characteristics sufficient to produce a second electromagnetic field having field lines running through a core of the induction coil, and through the inner volume generally parallel to the central axis of the plasma containment vessel.

14. The method of claim 13, further comprising producing the plasma plume in a substantially cylindrical shape, and of sufficient thermal energy to cause the glass batch material to thermally react.

15. The method of claim 14, wherein at least one of:
the thermal reaction includes at least partially melting the glass batch material,
the thermal reaction includes at least partially melting at least one of the glass batch material and one or more further materials thereby forming coated glass batch material particles, and
the thermal reaction includes at least partially melting the glass batch material to form substantially homogeneous, spheroid-shaped glass intermediate particles.

16. The method of claim 13, wherein the RF power is of a characteristic such that the first electromagnetic field exhibits a frequency of at least one of: (i) at least 1 MHz, (ii) at least 3 MHz, (iii) at least 4 MHz, (iv) at least 5 MHz, (v) at least 10 MHz, (vi) at least 15 MHz, (vii) at least 20 MHz, (viii) at least 30 MHz, (ix) at least 40 MHz, and (x) between about 1 to 50 MHz.

17. The method of claim 13, wherein the AC power is of a characteristic such that the second electromagnetic field exhibits a frequency of at least one of: (i) at least 10 kHz, (ii) at least 15 kHz, (iii) at least 20 kHz, (iv) at least 30 kHz, (v) at least 40 kHz, (vi) at least 50 kHz, (vii) at least 100 kHz, (viii) at least 150 kHz, (ix) at least 200 kHz, and (x) between about 10 to 250 kHz.

18. The method of claim 13, further comprising:
controlling a power level of the AC power, to thereby control an intensity of the second electromagnetic field, and to thereby control a temperature of the plasma plume,
wherein the plasma plume has a temperature ranging from one of: (i) about 9,000 K to about 18,000 K; (ii) about 11,000 K to about 15,000 K; and (iii) at least about 11,000 K.

19. The method of claim 13, further comprising adjusting a pressure and flow rate of the one or more sources of plasma gas in order to control one or more characteristics of cyclonic swirling of the plasma gas through the inner volume, thereby controlling a residence time of the glass batch material within the plasma plume.

20. The method of claim 13, further comprising dispensing the glass batch material generally parallel to the central axis of the plasma containment vessel and transverse to the plasma gas entering the inner volume tangentially to the central axis.

21. The method of claim 13, wherein a mean particle size of the glass batch material is at least one of: (i) at least about 10 um, (ii) at least about 50 um, (iii) at least about 75 um, (iv) at least about 100 um, (v) at least about 150 um, (vi) at least about 200 um, (vii) at least about 500 um, (viii) at least about 750 um, (ix) at least about 1000 um, and (x) from about 5 to about 1000 um.

22. The method of claim 13, wherein the plasma gas includes at least one of argon, air, helium, nitrogen, oxygen, and mixtures thereof.

* * * * *